(12) United States Patent
Tseng et al.

(10) Patent No.: US 12,513,848 B2
(45) Date of Patent: Dec. 30, 2025

(54) SERVER INFORMATION HANDLING SYSTEM HYBRID RAIL SUPPORT SYSTEM

(71) Applicant: Dell Products L.P., Round Rock, TX (US)

(72) Inventors: Chuan Chieh Tseng, Taipei (TW); Sam Shang, Shanghai (CN); Christopher Sismilich, Austin, TX (US); Kevin Garrett, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 315 days.

(21) Appl. No.: 18/239,692

(22) Filed: Aug. 29, 2023

(65) Prior Publication Data

US 2025/0081381 A1   Mar. 6, 2025

(51) Int. Cl.
*H05K 7/14* (2006.01)
*A47B 88/40* (2017.01)

(52) U.S. Cl.
CPC ........... *H05K 7/1489* (2013.01); *A47B 88/40* (2017.01)

(58) Field of Classification Search
CPC .................................................. H05K 7/1489
See application file for complete search history.

(56) References Cited

U.S. PATENT DOCUMENTS

| 7,093,725 B2 | 8/2006 | Hartman et al. | |
| 9,229,492 B2* | 1/2016 | Henderson | H05K 7/183 |
| 2014/0104777 A1* | 4/2014 | Henderson | A47B 96/06 |
| | | | 403/345 |

* cited by examiner

*Primary Examiner* — Jerry Wu
(74) *Attorney, Agent, or Firm* — Terrile, Cannatti & Chambers, LLP; Stephen A. Terrile

(57) ABSTRACT

A hybrid rail support system. The hybrid rail support system includes a wider width information handling system chassis; and, a hybrid rail support component extending from a front portion of the server rack to a rear portion of the server rack, the hybrid rail support component comprising: a static rail, the static rail being configured to mount to a side of a server rack; and, a sliding rail, the sliding rail being configured to move along the static rail from an inserted position to an extended position, the sliding rail being configured to mount to a rear portion of a wider width information handling system chassis, the sliding rail enabling the wider width information handling system chassis to extend from a rack to a rack service position.

12 Claims, 18 Drawing Sheets

SERVER INFORMATION HANDLING SYSTEM HYBRID RAIL SUPPORT SYSTEM

BACKGROUND OF THE INVENTION

Field of the Invention

The present invention relates to information handling systems. More specifically, embodiments of the invention relate to server type information handling systems within information technology (IT) environments.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

It is known to use information handling systems and related IT systems within information technology (IT) environments such as data centers.

SUMMARY OF THE INVENTION

A system and method for performing a wider width chassis servicing operation.

In one embodiment, the invention relates to a hybrid rail support component for a server type information handling system, comprising: a static rail, the static rail being configured to mount to a side of a server rack; and, a sliding rail, the sliding rail being configured to move along the static rail from an inserted position to an extended position, the sliding rail being configured to mount to a rear portion of a wider width information handling system chassis, the sliding rail enabling the wider width information handling system chassis to extend from a rack to a rack service position.

In another embodiment, the invention relates to a server rack comprising: a hybrid rail support component extending from a front portion of the server rack to a rear portion of the server rack, the hybrid rail support component comprising: a static rail, the static rail being configured to mount to a side of a server rack; and, a sliding rail, the sliding rail being configured to move along the static rail from an inserted position to an extended position, the sliding rail being configured to mount to a rear portion of a wider width information handling system chassis, the sliding rail enabling the wider width information handling system chassis to extend from a rack to a rack service position.

In another embodiment, the invention relates to a hybrid rail support system comprising: a wider width information handling system chassis; and, a hybrid rail support component extending from a front portion of the server rack to a rear portion of the server rack, the hybrid rail support component comprising: a static rail, the static rail being configured to mount to a side of a server rack; and, a sliding rail, the sliding rail being configured to move along the static rail from an inserted position to an extended position, the sliding rail being configured to mount to a rear portion of a wider width information handling system chassis, the sliding rail enabling the wider width information handling system chassis to extend from a rack to a rack service position.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
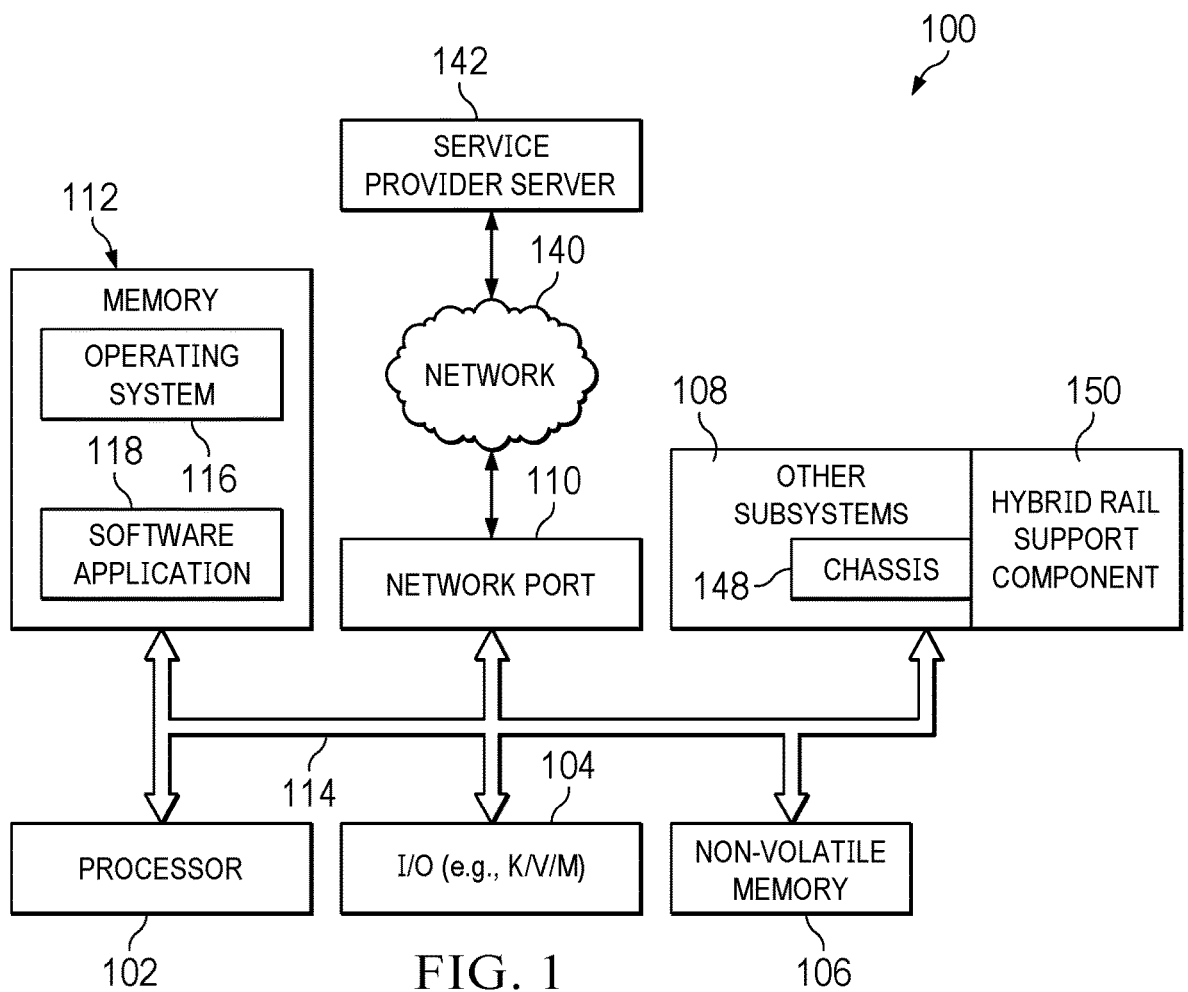
FIG. 1 shows a general illustration of components of an information handling system as implemented in the system and method of the present invention.

Various aspects of the disclosure include an appreciation that server racks can be configured to hold standard width server type information handling systems as well as wider width information handling systems. Various aspects of the present disclosure include an appreciation that certain standard width server type information handling systems can have a width of substantially (i.e., +/−10%) 434 mm. Various aspects of the present disclosure include an appreciation that certain wider width server type information handling systems can have a width of substantially (i.e., +/−10%) 448 mm. Various aspects of the present disclosure include an appreciation that the interior width of certain server racks can be substantially (i.e., +/−10%) 450 mm.

Various aspects of the disclosure include an appreciation that certain wider width information handling systems may be configured to hold two parallel arrays of storage modules such as hard drives. Various aspects of the present disclosure include an appreciation that a wider width information handling system can provide improved thermal performance of the server type information handling system.

Various aspects of the present disclosure include an appreciation that known rails that support a service position the wider width of the wider width information handling system leaves insufficient space for sliding rail structure features. Because of this, with known wider width information handling systems, to service the information handling system the entire chassis often needs to be powered off and removed from the rack. Various aspects of the present disclosure include an appreciation that it would be desirable to provide wider width information handling systems which can be accessed at a rack service position. For example, with multi bay storage type wider width information handling systems, it is desirable to allow hot swapping of drives when the chassis is in a rack service position.

A system and method are disclosed for performing a wider width chassis servicing operation. In certain embodiments, the wider width chassis servicing operation is performed by a hybrid rail support system. In certain embodiments, the hybrid rail support system includes a hybrid rail support component and a specifically configured information handling system chassis.

In certain embodiments, the hybrid rail support component is configured as a sliding ball bearing rail design with a static rail and a sliding rail. In certain embodiments, the sliding rail is configured to move along the static rail from an inserted position to an extended position. In certain embodiments, the static rail includes sliding rail ball bearings along which the sliding rail moves from an inserted position to an extended position. In certain embodiments, the static rail is configured to include a static rail L flange, a rail top wheel, a slam latch component, or a combination thereof.

In certain embodiments, the static rail L flange provides additional support to the wider width information handling system when the wider width infuriation handling system is in the rack service position. In certain embodiments, the static rail L flange includes a friction reducing portion which reduces system friction as the chassis is extended to the rack service position and inserted back to an operational position. In certain embodiments, the friction reducing portion includes a nylon plate positioned on an inside top portion of the static rail L flange, a flange support wheel positioned on an inside side portion of the static rail L flange, or a combination there.

In certain embodiments, the hybrid rail support component includes a rail top wheel which interacts with the standard width portion of the chassis allowing the system to be slid out to service position. In certain embodiments, the rail top wheel is physically attached to a top portion of the static rail.

In certain embodiments, the slam latch component includes an extended slam latch hook, a rail mount wrap around portion, or a combination thereof. In certain embodiments, the extended slam latch hook is configured to extend beyond the rail mount wrap around portion. In certain embodiments, the rail mount wrap around portion is configured to wrap from a front of a mounting portion of the hybrid rail component to an outside of the mounting portion of the hybrid rail mounting portion. By being so configured, the rail mount wrap around portion enables clearance with the server rack for the wider width portion of the chassis when the chassis is extended to the rack service position and inserted back to an operational position.

In certain embodiments, the specifically configured information handling system chassis includes a wider width portion and a standard width portion. In certain embodiments, the wider width portion is positioned at the front of the chassis and the standard width portion is positioned at the rear of the chassis. In certain embodiments, the wider width portion extends from the front of the chassis to substantially half way down the depth of the chassis. In certain embodiments, the wider width portion extends along a top edge of the entire chassis. In certain embodiments, the standard width portion extends from substantially halfway down the depth of the chassis to the rear of the chassis. In certain embodiments, the standard width portion of the chassis is positioned along a bottom edge of the rear of the chassis. In certain embodiments, the sliding rail of the hybrid rail component is mounted to the standard width portion of the chassis. In certain embodiments, the sliding rail of the hybrid rail component is mounted along a bottom edge of the standard width portion of the chassis.

FIG. 1 shows a generalized illustration of an information handling system 100 that can be used to implement the system and method of the present invention. The information handling system 100 includes a processor (e.g., central processor unit or "CPU") 102, input/output (I/O) devices 104, such as a display, a keyboard, a mouse, and associated controllers, a hard drive or disk storage 106, and various other subsystems 108. In various embodiments, the information handling system 100 also includes network port 110 operable to connect to a network 140, which is likewise accessible by a service provider server 142. The information handling system 100 likewise includes system memory 112, which is interconnected to the foregoing via one or more buses 114. System memory 112 further comprises operating system (OS) 116. In certain embodiments, the information handling system 100 is one of a plurality of information handling systems within a data center. In certain embodiments, the information handling system 100 comprises a server type information handling system. In certain embodiments, the server type information handling system is configured to be mounted within a server rack.

In certain embodiments, the information handling system 100 comprises a server type information handling system. In certain embodiments, the server type information handling system comprises a rack server type information handling system. As used herein, a rack server type information handling system broadly refers to an information handling system which is physically configured to be mounted within a server rack.

In certain embodiments, the other sub systems 108 include a chassis 148. In certain embodiments, some or all of the other components of the information handling system 100 are contained within the chassis 148. In certain embodiments, the chassis interacts with a rail 150. In certain embodiments, the rail 150 physically attaches the chassis 148 to a server rack. In certain embodiments, the chassis 148 includes a wider width chassis. In certain embodiments, the rail is configured as a hybrid rail support component. In certain embodiments, the chassis 148 and the hybrid rail support component provide a hybrid rail support system.

In certain embodiments, the hybrid rail support system includes a hybrid rail support component and a specifically configured information handling system chassis. In certain embodiments, the hybrid rail support component is configured as a sliding ball bearing rail design with a static rail and a sliding rail. In certain embodiments, the static rail includes sliding rail ball bearings along which the sliding rail moves from an inserted position to an extended position. In certain embodiments, the static rail is configured to include a static rail L flange, a rail top wheel, a slam latch component, or a combination thereof.

In certain embodiments, the static rail L flange provides additional support to the wider width information handling system when the wider width infuriation handling system is in the rack service position. In certain embodiments, the static rail L flange includes a friction reducing portion which reduces system friction as the chassis is extended to the rack service position and inserted back to an operational position. In certain embodiments, the friction reducing portion includes a nylon plate positioned on an inside top portion of the static rail L flange, a flange support wheel positioned on an inside side portion of the static rail L flange, or a combination there.

In certain embodiments, the hybrid rail support component includes a rail top wheel which interacts with the standard width portion of the chassis allowing the system to be slid out to service position. In certain embodiments, the rail top wheel is physically attached to a top portion of the static rail.

In certain embodiments, the slam latch component includes an extended slam latch hook, a rail mount wrap around portion, or a combination thereof. In certain embodiments, the extended slam latch hook is configured to extend beyond the rail mount wrap around portion. In certain embodiments, the rail mount wrap around portion is configured to wrap from a front of a mounting portion of the hybrid rail component to an outside of the mounting portion of the hybrid rail mounting portion. By being so configured, the rail mount wrap around portion enables clearance with the server rack for the wider width portion of the chassis when the chassis is extended to the rack service position and inserted back to an operational position.

In certain embodiments, the specifically configured information handling system chassis includes a wider width portion and a standard width portion. In certain embodiments, the wider width portion is positioned at the front of the chassis and the standard width portion is positioned at the rear of the chassis. In certain embodiments, the wider width portion extends from the front of the chassis to substantially half way down the depth of the chassis. In certain embodiments, the wider width portion extends along a top edge of the entire chassis. In certain embodiments, the standard width portion extends from substantially halfway down the depth of the chassis to the rear of the chassis. In certain embodiments, the standard width portion of the chassis is positioned along a bottom edge of the rear of the chassis. In certain embodiments, the sliding rail of the hybrid rail component is mounted to the standard width portion of the chassis. In certain embodiments, the sliding rail of the hybrid rail component is mounted along a bottom edge of the standard width portion of the chassis.

Figure 2:
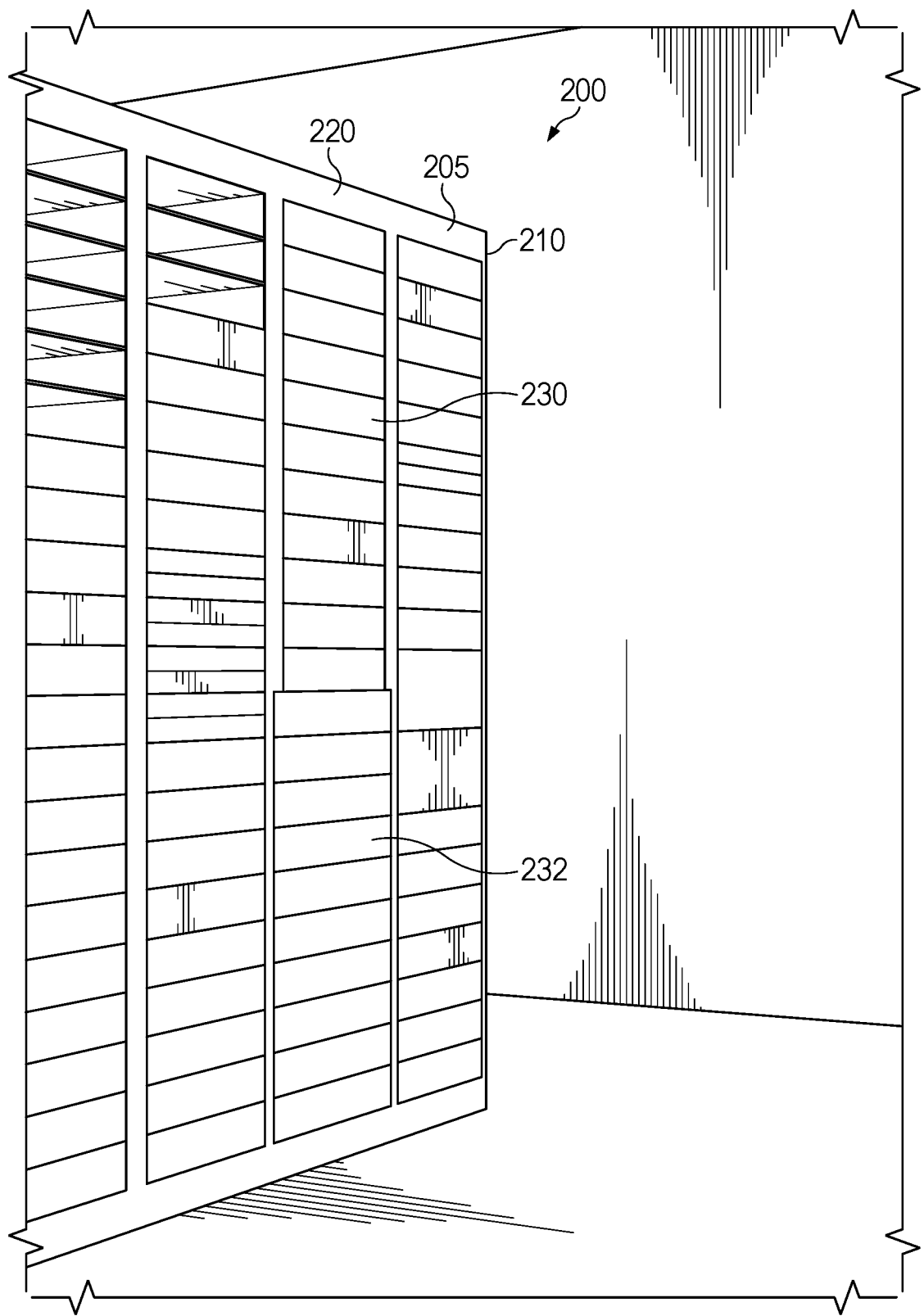
FIG. 2 shows a perspective view of a portion of a data center within an IT environment.

FIG. 2 shows a perspective view of a portion of an IT environment 200. The IT environment includes one or more racks 205 which include a plurality of information handling systems 100, often referred to as a server rack. In various embodiments, the IT environment 200 comprises a data center. As used herein, a data center refers to an IT environment which includes a plurality of networked information handling systems 100. In various embodiments, the information handling systems 100 of the data center include some or all of router type information handling systems, switch type information handling systems, firewall type information handling systems, storage system type information handling systems, server type information handling systems, and application delivery controller type information handling systems. In certain environments, the information handling systems 100 are mounted within respective racks. As used herein, a rack refers to a physical structure that is designed to house the information handling systems 100 as well as the associated cabling and power provision for the information handling systems. In certain embodiments, a rack includes side panels to which the information handling systems are mounted. In certain embodiments, the rack includes a top panel and a bottom panel to which the side panels are attached. In certain embodiments, the side panels each include a front side panel and a rear side panel.

In certain embodiments, a plurality of racks is arranged continuous with each other to provide a rack system. An IT environment can include a plurality of rack systems arranged in rows with aisles via which IT service personnel can access information handling systems mounted in the racks. In certain embodiments, the aisles can include front aisles via which the front of the information handling systems may be accessed and hot aisles via which the infrastructure (e.g., data and power cabling) of the IT environment can be accessed.

Each respective rack includes a plurality of vertically arranged information handling systems 210. In certain embodiments, the information handling systems may conform to one of a plurality of standard server sizes. In certain embodiments, the plurality of server sizes conforms to particular rack unit sizes (i.e., rack units). As used herein, a rack unit broadly refers to a standardized server system height. As is known in the art, a server system height often conforms to one of a 1 U rack unit, a 2 U rack unit and a 4 U rack unit. In general, a 1 U rack unit is substantially (i.e., +/−20%) 1.75" high, a 2 U rack unit is substantially (i.e., +/−20%) 3.5" high, and a 4 U rack height is substantially (i.e., +/−20%) 7.0" high.

In certain embodiments, one or more of the plurality of racks are configured to include a standard width portion 230 to hold standard width server type information handling systems as well as a wider width portion 232 to hold wider width information handling systems. In certain embodiments the standard width server type information handling systems have a width of substantially (i.e., +/−10%) 434 mm. In certain embodiments, the wider width server type information handling systems have a width of substantially (i.e., +/−10%) 448 mm. In certain embodiments, the interior width of one or more of the plurality of server racks can be substantially (i.e., +/−10%) 450 mm.

Figure 3A:
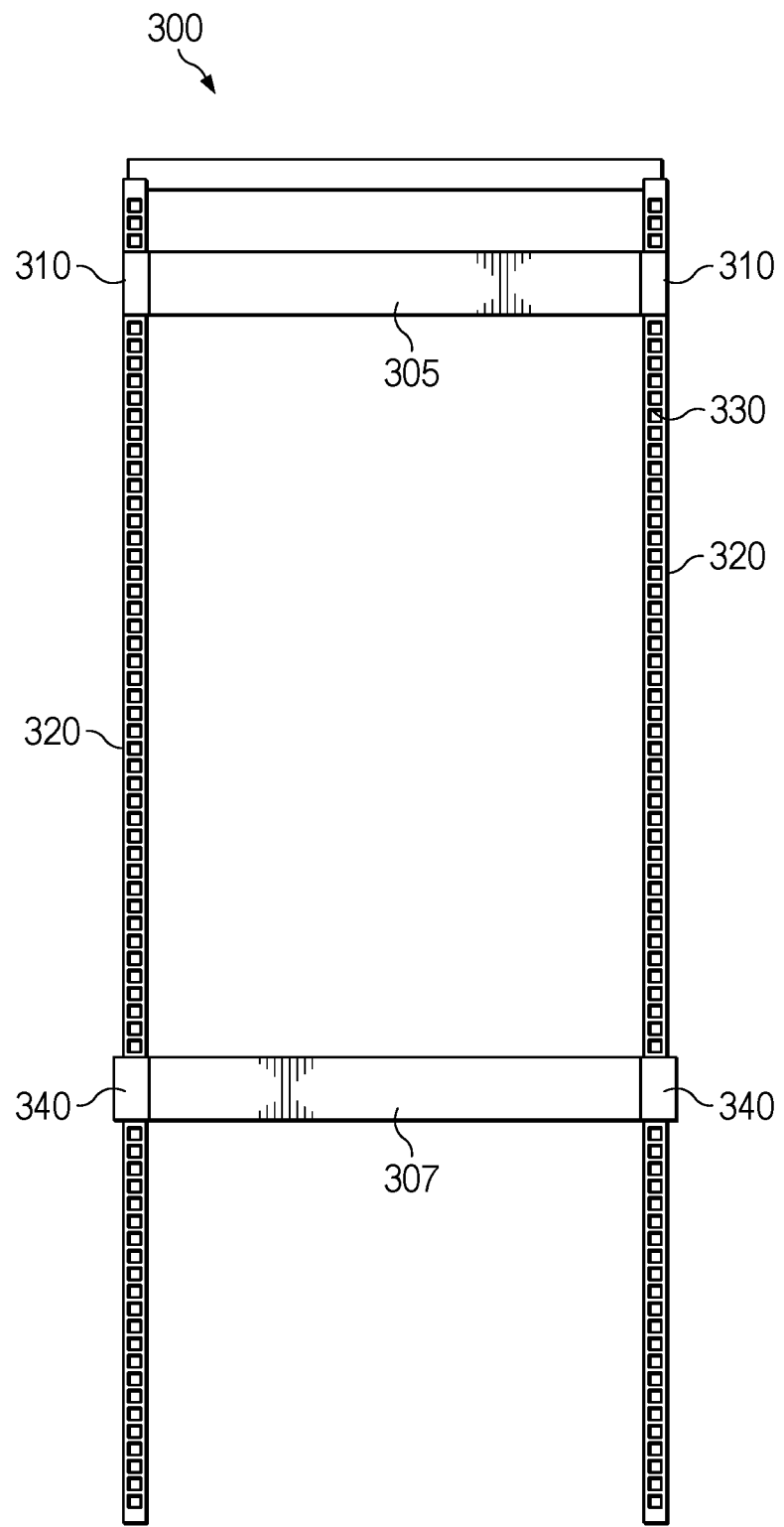
FIGS. 3A, 3B and 3C show a rack front view, a rack side view, and a rack side view with an information handling system in an accessible position.
Figure 3C:
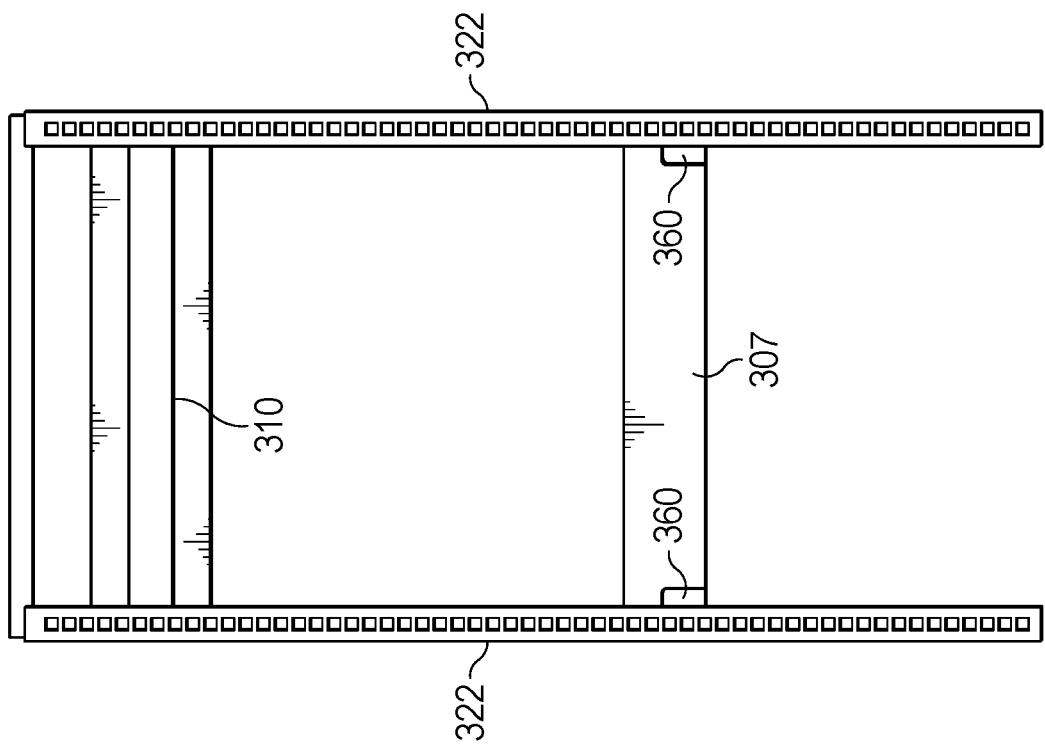
Figure 3B:
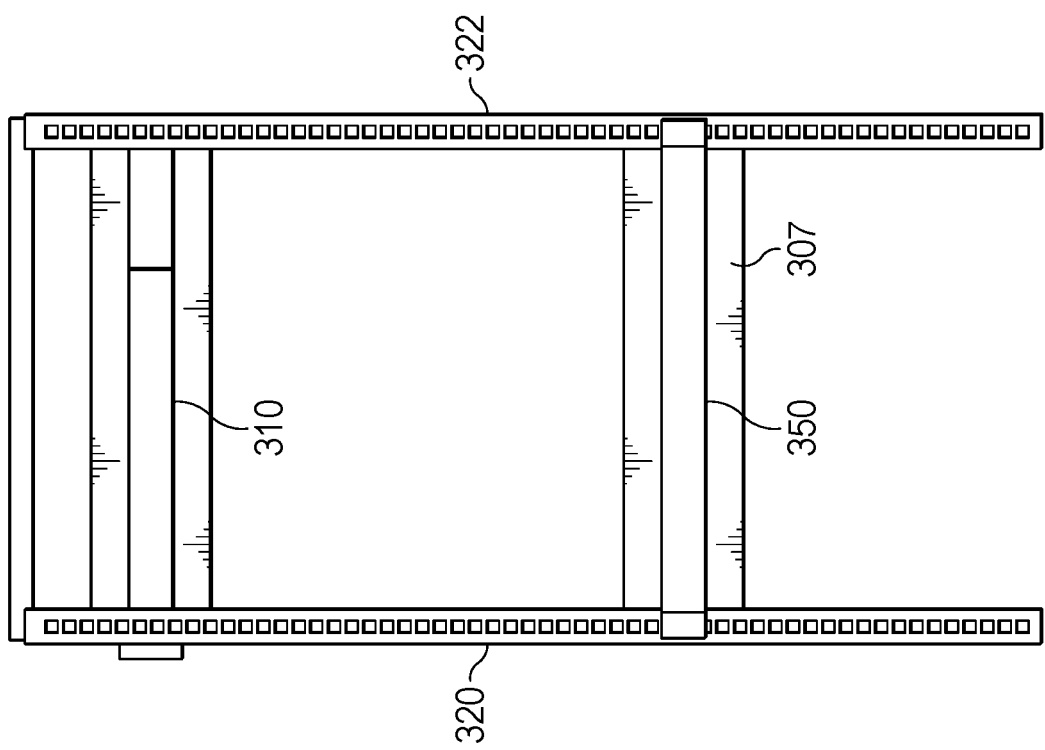

FIGS. 3A, 3B and 3C show a rack front view, a rack side view, and a rack rear view with an information handling system 305 and an information handling system 307.

In certain embodiments the information handling system 305 comprises standard width server type information handling systems having a width of substantially (i.e., +/−10%) 434 mm. In certain embodiments, the information handling system 307 comprises a wider width server type information handling systems having a width of substantially (i.e., +/−10%) 448 mm. In certain embodiments, the interior width of one or more of the plurality of server racks can be substantially (i.e., +/−10%) 450 mm.

A first server mounting component 310 is attached to one side of the rack and a second server mounting component 310 is attached to another side of the rack. In certain embodiments, the first server mounting component is attached to a first front side panel 320 and a first rear side panel 322 of the rack 300. In certain embodiments, the second server mounting component is attached to a second front side panel 320 and a second rear side panel 322 of the rack 300. In certain embodiments, the first server mounting component 320 is attached via the mounting apertures 330. In certain embodiments, the second server mounting component is attached via the mounting apertures 330. In certain embodiments, a rear component 330 is attached between the first server mounting component 310 and the second server mounting component 310.

A first hybrid server mounting component 340 is attached to one side of the rack and a second hybrid mounting component 340 is attached to another side of the rack. In certain embodiments, the hybrid server mounting component 340 is attached to a first front side panel 320 and a first rear side panel 322 of the rack 300. In certain embodiments, the hybrid server mounting component is attached to a second front side panel 320 and a second rear side panel 322 of the rack 300. In certain embodiments, the first hybrid server mounting component 340 is attached via the mounting apertures 330. In certain embodiments, the second hybrid server mounting component is attached via the mounting apertures 330. In certain embodiments, a rear component 330 is attached between the first server mounting component 310 and the second server mounting component 310.

In certain embodiments, the information handling system 307 includes a specifically configured information handling system chassis 350. In certain embodiments, the specifically configured information handling system chassis 350 comprises a wider width information handling system chassis. In certain embodiments, the specifically configured information handling system chassis 350 includes a rear standard width portion 360. In certain embodiments, the first hybrid server mounting component is physically coupled to a first side of the rear standard width portion 360 of the specifically configured wider width information handling system chassis 350. In certain embodiments, the second hybrid server mounting component is coupled to a second side of the rear standard width portion 360 of the specifically configured wider width information handling system chassis 350.

In certain embodiments, a rack includes a plurality of vertically arranged mounting components. In certain embodiments, some or all of the vertically arranged mounting components are adapted to mount respective rack server type information handling systems to the rack. In certain embodiments, the server mounting components are configured to correspond to particular rack unit heights. In certain embodiments, some of the server mounting components 310 include respective hybrid rail support components. In certain embodiments, the information handling system 305 includes a specifically configured information handling system chassis. In certain embodiments, the hybrid rail support component is configured as a sliding ball bearing rail design with a static rail and a sliding rail. In certain embodiments, the static rail includes sliding rail ball bearings along which the sliding rail moves from an inserted position to an extended position. In certain embodiments, the static rail is configured to include a static rail L flange, a rail top wheel, a slam latch component, or a combination thereof.

In certain embodiments, the static rail L flange provides additional support to the wider width information handling system when the wider width infuriation handling system is in the rack service position. In certain embodiments, the static rail L flange includes a friction reducing portion which reduces system friction as the chassis is extended to the rack service position and inserted back to an operational position. In certain embodiments, the friction reducing portion includes a nylon plate positioned on an inside top portion of the static rail L flange, a flange support wheel positioned on an inside side portion of the static rail L flange, or a combination there.

In certain embodiments, the rail top wheel interacts with the standard width portion of the chassis allowing the system to be slid out to service position. In certain embodiments, the rail top wheel is physically attached to a top portion of the static rail.

In certain embodiments, the slam latch component includes an extended slam latch hook, a rail mount wrap around portion, or a combination thereof. In certain embodiments, the extended slam latch hook is configured to extend beyond the rail mount wrap around portion. In certain embodiments, the rail mount wrap around portion is configured to wrap from a front of a mounting portion of the hybrid rail component to an outside of the mounting portion of the hybrid rail mounting portion. By being so configured, the rail mount wrap around portion enables clearance with the server rack for the wider width portion of the chassis when the chassis is extended to the rack service position and inserted back to an operational position.

In certain embodiments, the specifically configured information handling system chassis includes a wider width portion and a standard width portion. In certain embodiments, the wider width portion is positioned at the front of the chassis and the standard width portion is positioned at the rear of the chassis. In certain embodiments, the wider width portion extends from the front of the chassis to substantially half way down the depth of the chassis. In certain embodiments, the wider width portion extends along a top edge of the entire chassis. In certain embodiments, the standard width portion extends from substantially halfway down the depth of the chassis to the rear of the chassis. In certain embodiments, the standard width portion of the chassis is positioned along a bottom edge of the rear of the chassis. In certain embodiments, the sliding rail of the hybrid rail component is mounted to the standard width portion of the chassis. In certain embodiments, the sliding rail of the hybrid rail component is mounted along a bottom edge of the standard width portion of the chassis.

Figure 4:
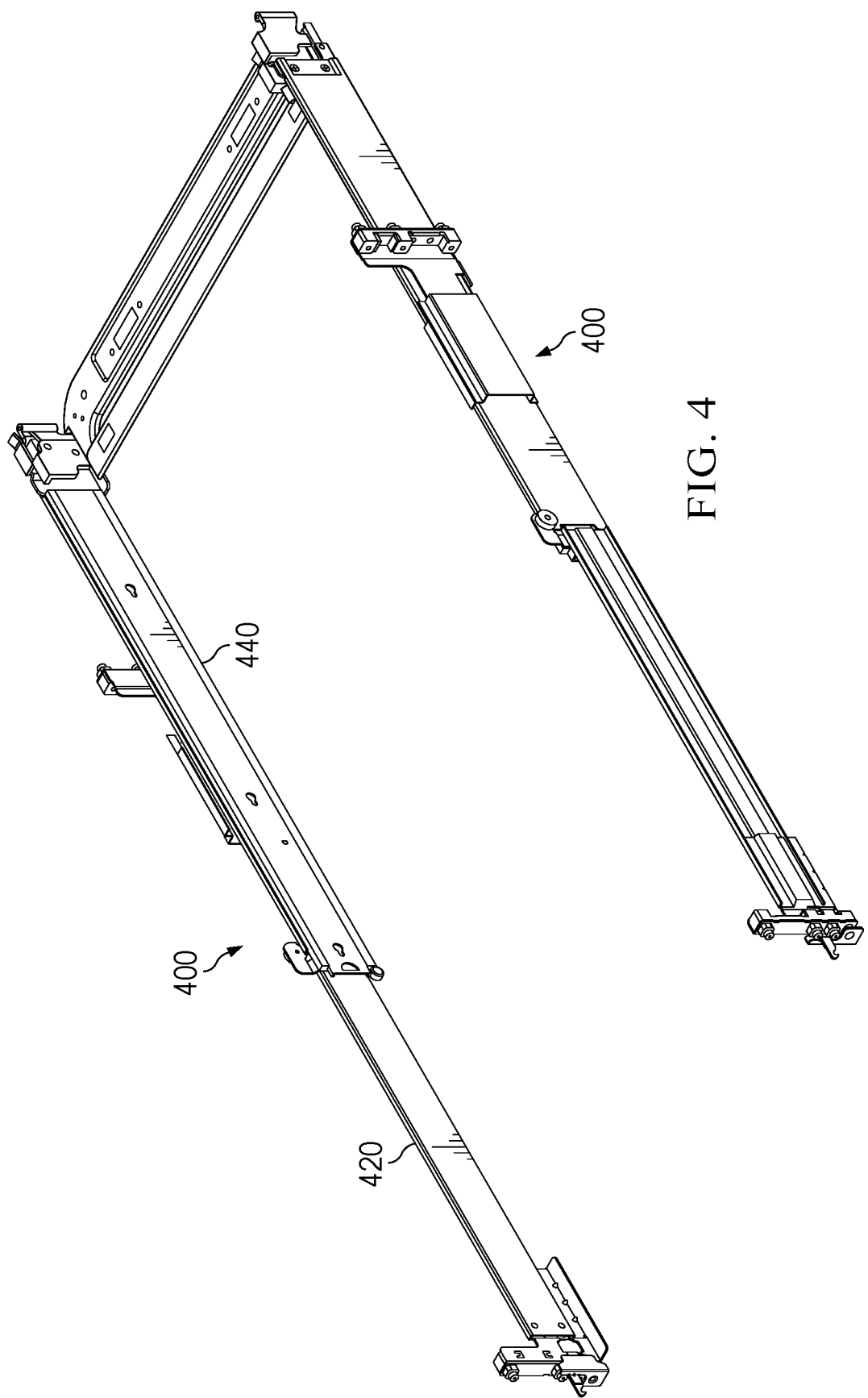
FIG. 4 shows a perspective view of server mounting components attached to a rack.

FIG. 4 shows a perspective view of server mounting components 400 attached to a rack. In certain embodiments, the server mounting components 400 include a right server mounting component 420 (i.e., a first server mounting component) and a left server mounting component 420 (i.e., a second server mounting component). In certain embodiments, the first server mounting component 420 is attached to one side of the rack and the second server mounting component 420 is attached to another side of the rack. In certain embodiments, the first server mounting component is attached to a first front side panel 430 and a first rear side panel 432 of the rack. In certain embodiments, the second server mounting component is attached to a second front side panel 430 and a second rear side panel 432 of the rack. In certain embodiments, the server mounting components 400 include one or more mechanical guiding features 440 mechanically coupled to respective server mounting components 420.

In certain embodiments, the right server mounting component and the second server mounting component include respective right and left hybrid rail support components. In certain embodiments, each hybrid rail support component is configured as a sliding ball bearing rail design with a static rail and a sliding rail. In certain embodiments, the sliding ball bearing rail corresponds to the portion of the server mounting component mounted to the rack and the sliding rail corresponds to respective mechanical guiding features 440. In certain embodiments, the static rail 420 includes sliding rail ball bearings along which the sliding rail moves from an inserted position to an extended position. In certain embodiments, when the static rail is in the extended position, the static rail extends to substantially half the position of a fully extended information handling system (i.e., the rack service position).

In certain embodiments, the static rail is configured to include a static rail L flange, a rail top wheel, a slam latch component, or a combination thereof. In certain embodiments, the static rail L flange provides additional support to the wider width information handling system when the wider width infuriation handling system is in the rack service position. In certain embodiments, the static rail L flange includes a flange shelf extending inwardly from the static rail. In certain embodiments, the static rail L flange includes a friction reducing portion which reduces system friction as the chassis is extended to the rack service position and inserted back to an operational position. In certain embodiments, the friction reducing portion includes a nylon plate positioned on an inside top portion of shelf of the static rail L flange, a flange support wheel positioned on an inside side portion of the static rail L flange, or a combination thereof.

In certain embodiments, the rail top wheel interacts with the standard width portion of the chassis allowing the system to be slid out to service position. In certain embodiments, the rail top wheel is physically attached to a top portion of the static rail.

In certain embodiments, the slam latch component includes an extended slam latch hook, a rail mount wrap around portion, or a combination thereof. In certain embodiments, the extended slam latch hook is configured to extend beyond the rail mount wrap around portion. In certain embodiments, the rail mount wrap around portion is configured to wrap from a front of a mounting portion of the hybrid rail component to an outside of the mounting portion of the hybrid rail mounting portion. By being so configured, the rail mount wrap around portion enables clearance with the server rack for the wider width portion of the chassis when the chassis is extended to the rack service position and inserted back to an operational position. In certain embodiments, the rail mount wrap around portion is divided into two pieces so as to accommodate fitting the wider width portion of the information handling system chassis within a standard width rack.

Figure 5:
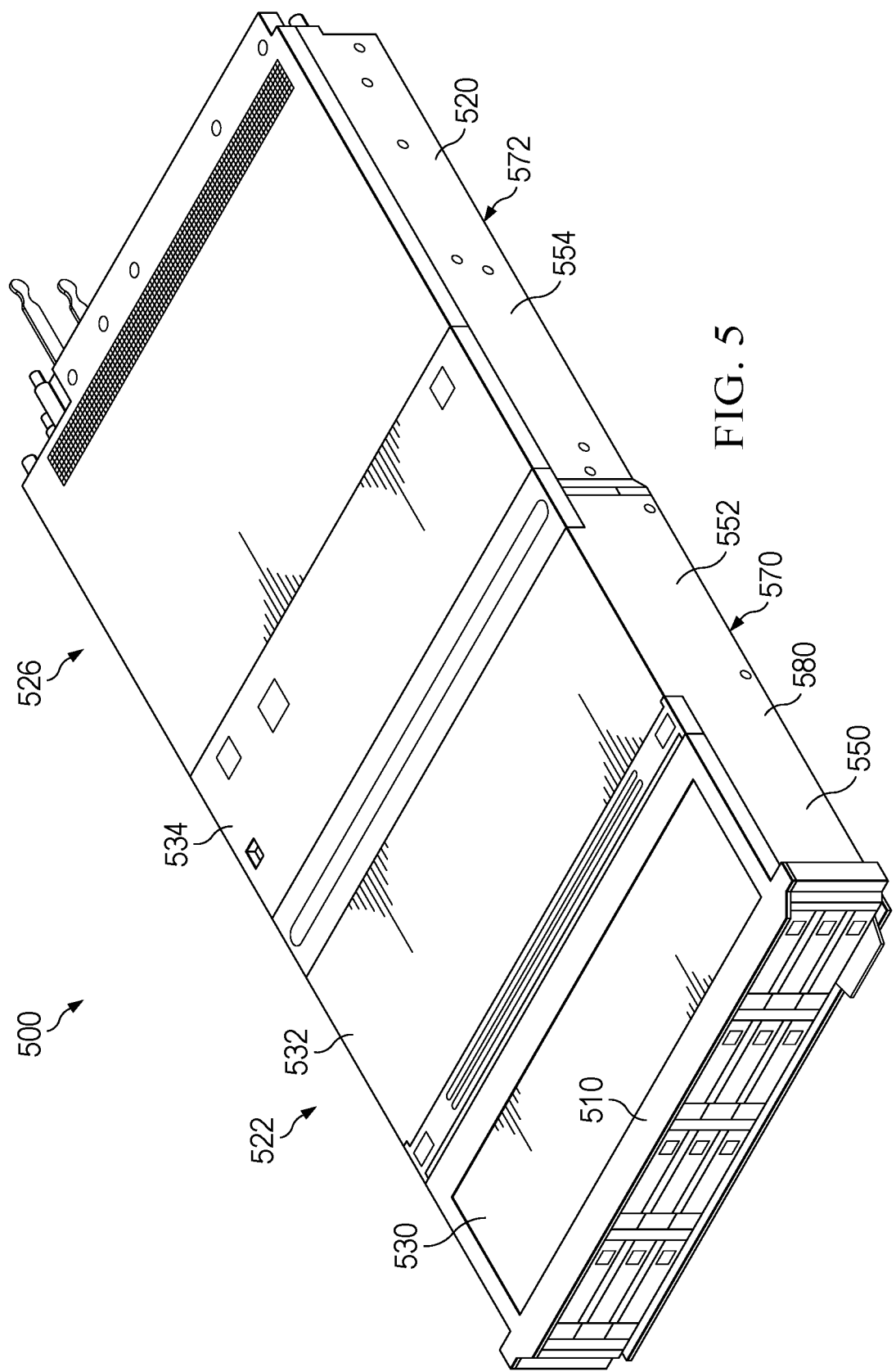
FIG. 5 shows a generalized perspective view of an example rack server type information handling system.

FIG. 5 shows a generalized perspective view of an example rack server type information handling system 500. In certain embodiments, the rack server type information handling system 500 includes a specifically configured information handling system chassis. In certain embodiments, the information handing system includes a front portion 510, which is accessible when the rack server type information handing system 500 is mounted on a server rack. In certain embodiments, the side portions 520, 522 mount to the rack via respective server mounting components. In certain embodiments, the side portions mount to the rack via respective mechanical guiding features which are mechanically coupled to respective server mounting components. In certain embodiments, the rack server type information handing system can slide out from the rack via the respective mechanical guiding features. In certain embodiments, internal components of the rack type information handing system 500 may be accessed by removing a top panel 530, 532, 534 of the rack type information handing system 500.

In certain embodiments, the rack type information handing system 500 includes a first row of bays 550 via which a first row of components may be mounted to the rack type information handling system 500. In certain embodiments, the rack type information handing system 500 includes a second row of bays 552 via which a second row of components may be mounted to the rack type information handling system. In certain embodiments, the rack type information handing system 500 includes a fan mounting portion 556 via which a one or more fans may be mounted to the rack type information handling system. In certain embodiments, the first row of components 550, the second row of components 552 and the fans mounted within the fan mounting portion 556 are accessed via respective top panels 530, 532 and 534.

In certain embodiments, the specifically configured information handling system chassis includes left and right rack ear portions 560, 562, respectively. In certain embodiments, the specifically configured information handing system chassis includes a wider width portion 570 and a standard width portion 572. In certain embodiments, the wider width portion 570 is positioned at the front of the chassis and the standard width portion 572 is positioned at the rear of the chassis. In certain embodiments, the wider width portion 570 extends from the front of the chassis to substantially half way down the depth of the chassis. In certain embodiments, the wider width portion 570 extends along a top edge of the entire chassis. In certain embodiments, the standard width portion 572 extends from substantially halfway down the depth of the chassis to the rear of the chassis. In certain embodiments, the standard width portion 572 of the chassis is positioned along a bottom edge of the rear of the chassis. In certain embodiments, the sliding rail of the hybrid rail component is mounted to the standard width portion 572 of the chassis. In certain embodiments, the wider width portion has a width that is sufficient to fit within a standard rack width, but is too wide to accommodate a sliding rail. In certain embodiments, the sliding rail of the hybrid rail component is mounted along a bottom edge of the standard width portion of the chassis.

Figure 6A:
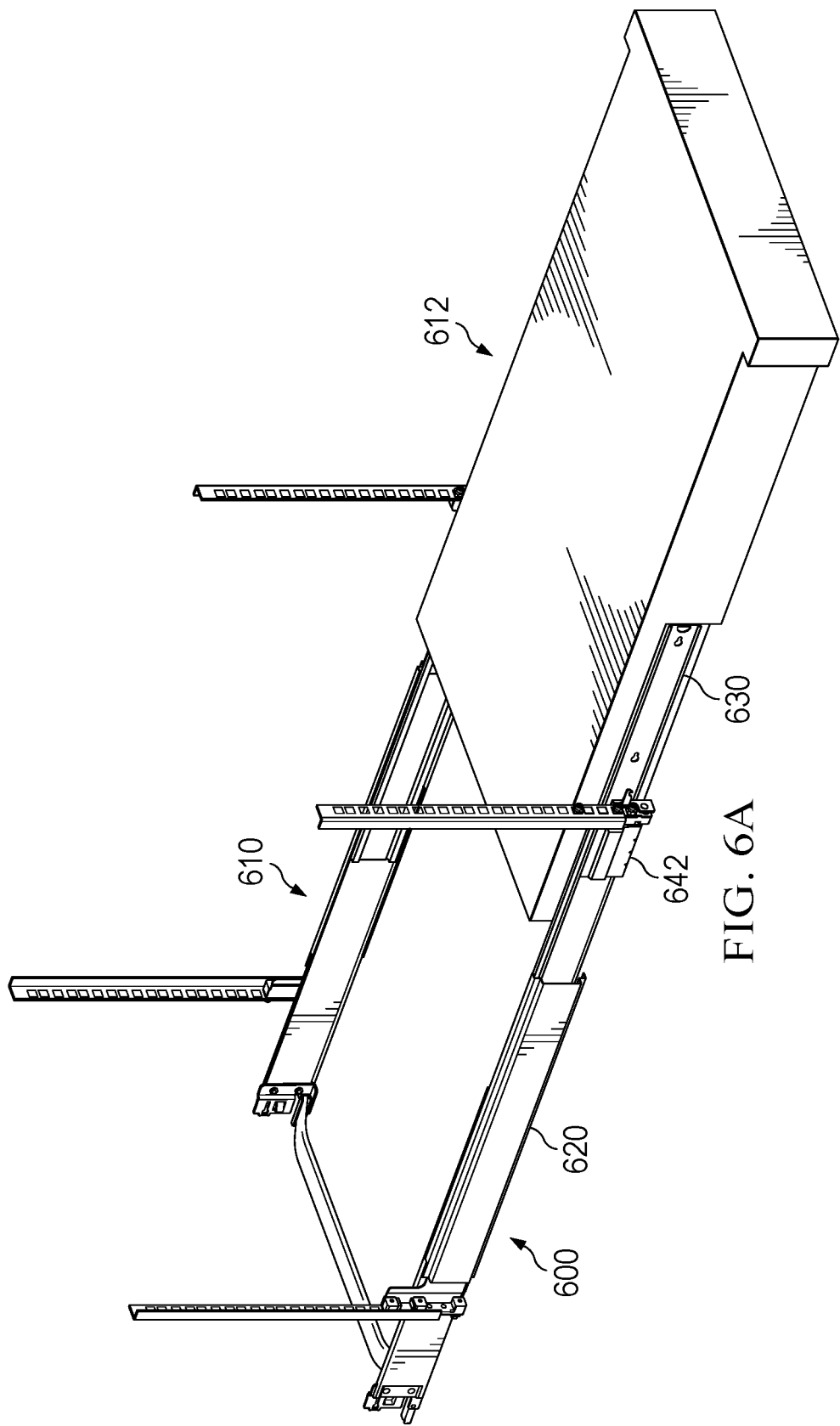
FIGS. 6A, 6B and 6C, generally referred to as FIG. 6, show a perspective view of a hybrid rail support system, a perspective view of a portion of a hybrid rail support system and a top view of a hybrid rail support system.
Figure 6B:
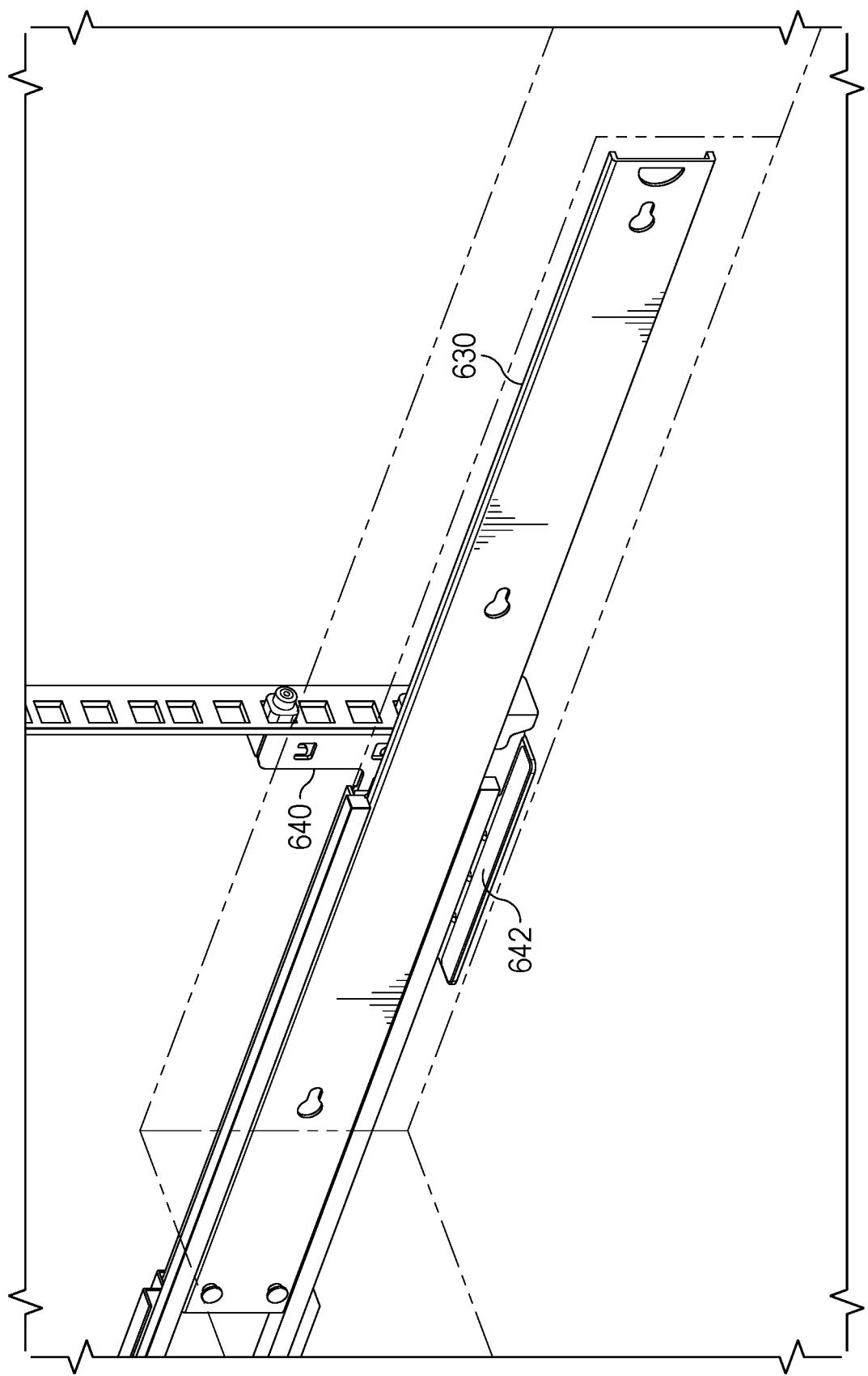
Figure 6C:
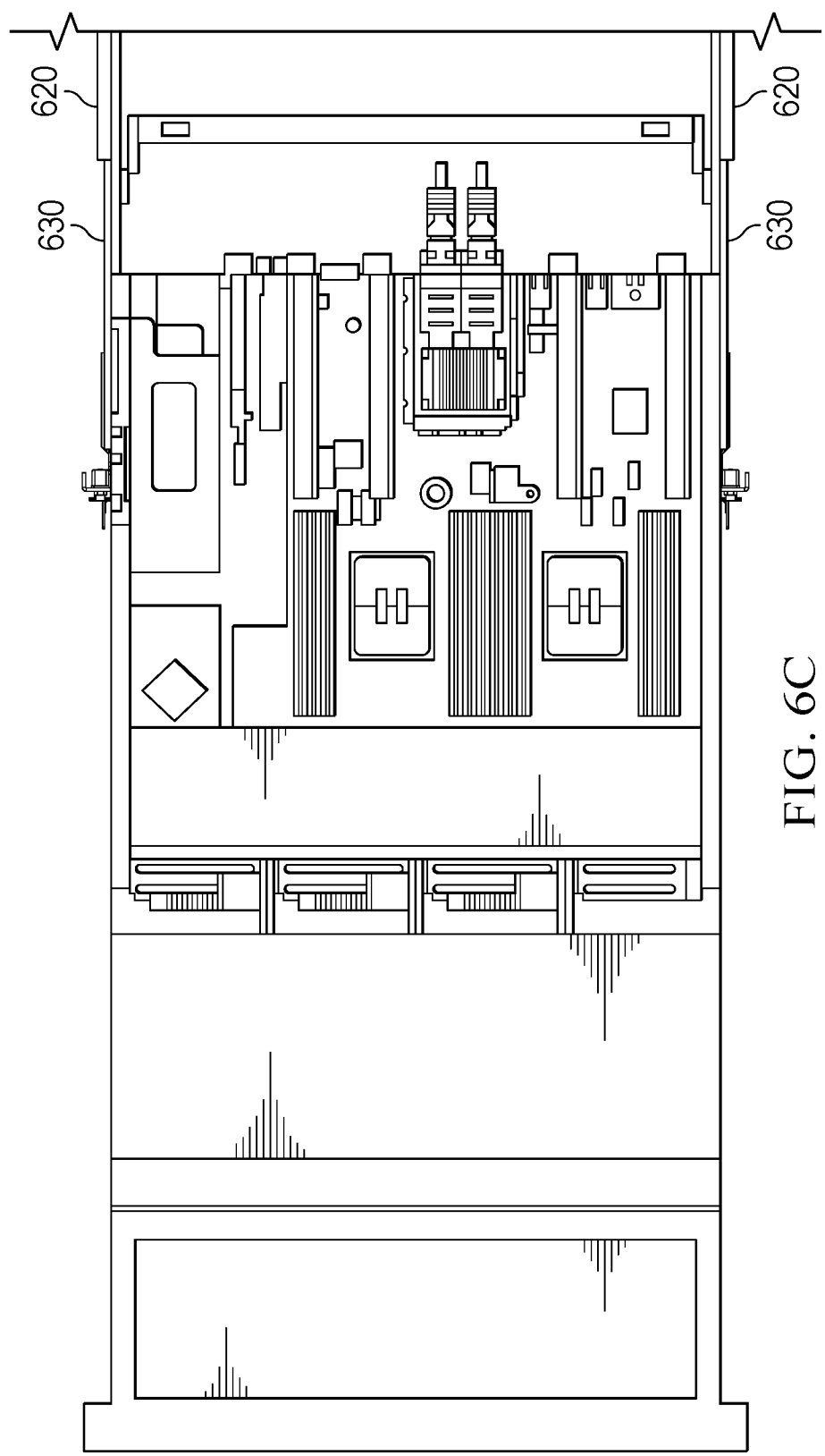

FIGS. 6A, 6B and 6C, generally referred to as FIG. 6, show a perspective view of a hybrid rail support system, a perspective view of a portion of a hybrid rail support system and a top view of a hybrid rail support system. In certain embodiments, the hybrid rail support system 600 includes an information handling system 612 which includes a specifically configured information handling system chassis and left and right hybrid rail support components. In certain embodiments, each hybrid rail support component is configured as a sliding ball bearing rail design with a static rail and a sliding rail. In certain embodiments, the static rail 620 includes sliding rail ball bearings along which the sliding rail 630 moves from an inserted position to an extended position. In certain embodiments, when the sliding rail 630 is in the extended position, the sliding rail extends to substantially half the position of a fully extended information handling system (i.e., the rack service position).

In certain embodiments, the static rail 620 is configured to include a static rail L flange 640, a rail top wheel, a slam latch component, or a combination thereof. In certain embodiments, the static rail L flange 640 provides additional support to the wider width information handling system when the wider width information handling system is in the rack service position. In certain embodiments, the static rail L flange 640 includes a flange shelf extending inwardly from the static rail. In certain embodiments, the static rail L flange 640 includes a friction reducing portion which reduces system friction as the chassis is extended to the rack service position and inserted back to an operational position. In certain embodiments, the friction reducing portion includes a nylon plate positioned on an inside top portion of the static rail L flange, a flange support wheel positioned on an inside side portion of the static rail L flange, or a combination thereof.

In certain embodiments, the rail top wheel interacts with the standard width portion of the chassis allowing the system to be slid out to service position. In certain embodiments, the rail top wheel is physically attached to a top portion of the static rail.

In certain embodiments, the slam latch component includes an extended slam latch hook, a rail mount wrap around portion, or a combination thereof. In certain embodiments, the extended slam latch hook is configured to extend beyond the rail mount wrap around portion. In certain embodiments, the rail mount wrap around portion is configured to wrap from a front of a mounting portion of the hybrid rail component to an outside of the mounting portion of the hybrid rail mounting portion. By being so configured, the rail mount wrap around portion enables clearance with the server rack for the wider width portion of the chassis when the chassis is extended to the rack service position and inserted back to an operational position.

Figure 7A:
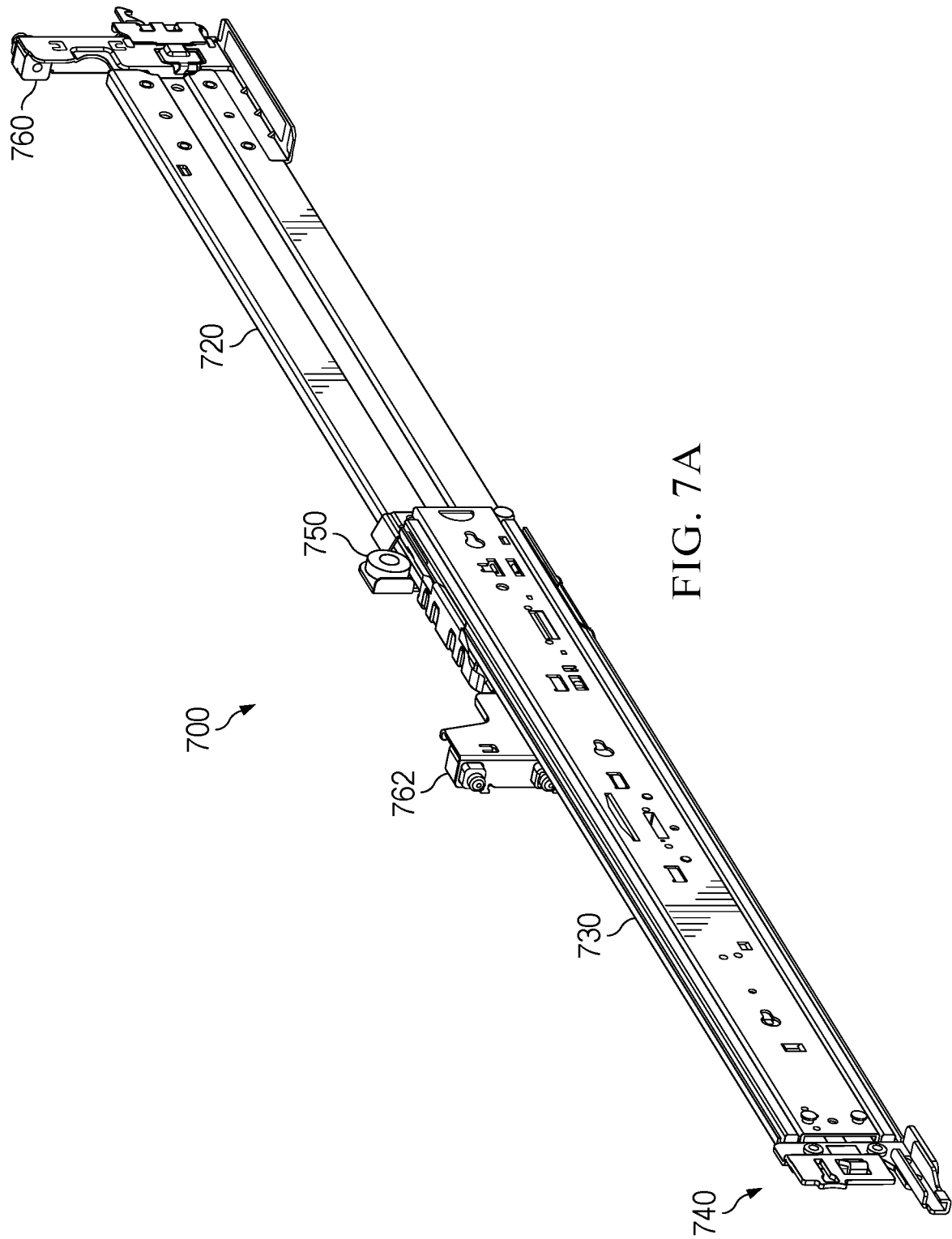
FIGS. 7A and 7B, generally referred to as FIG. 7 show perspective views of a hybrid rail support component.
Figure 7B:
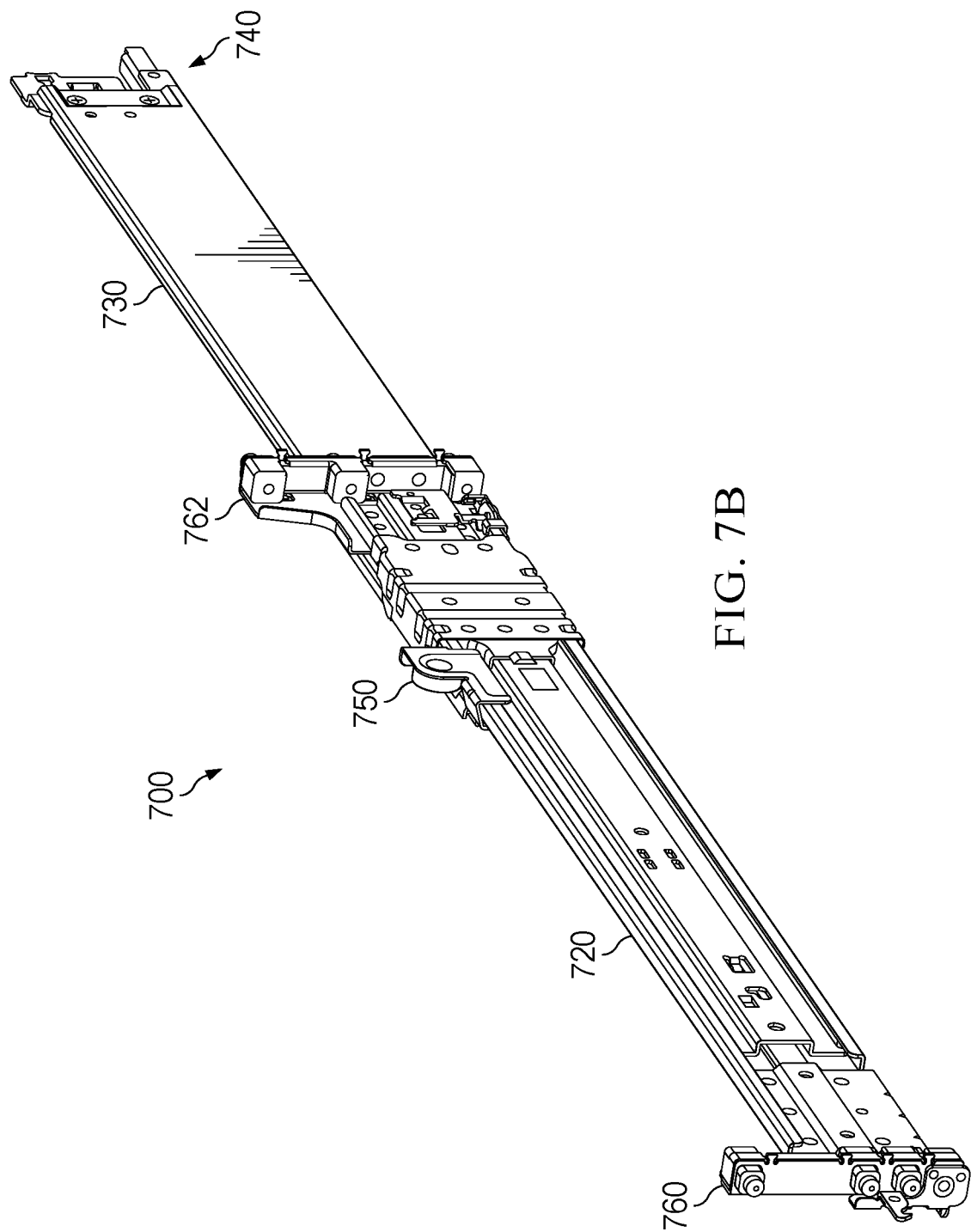
Figure 8A:
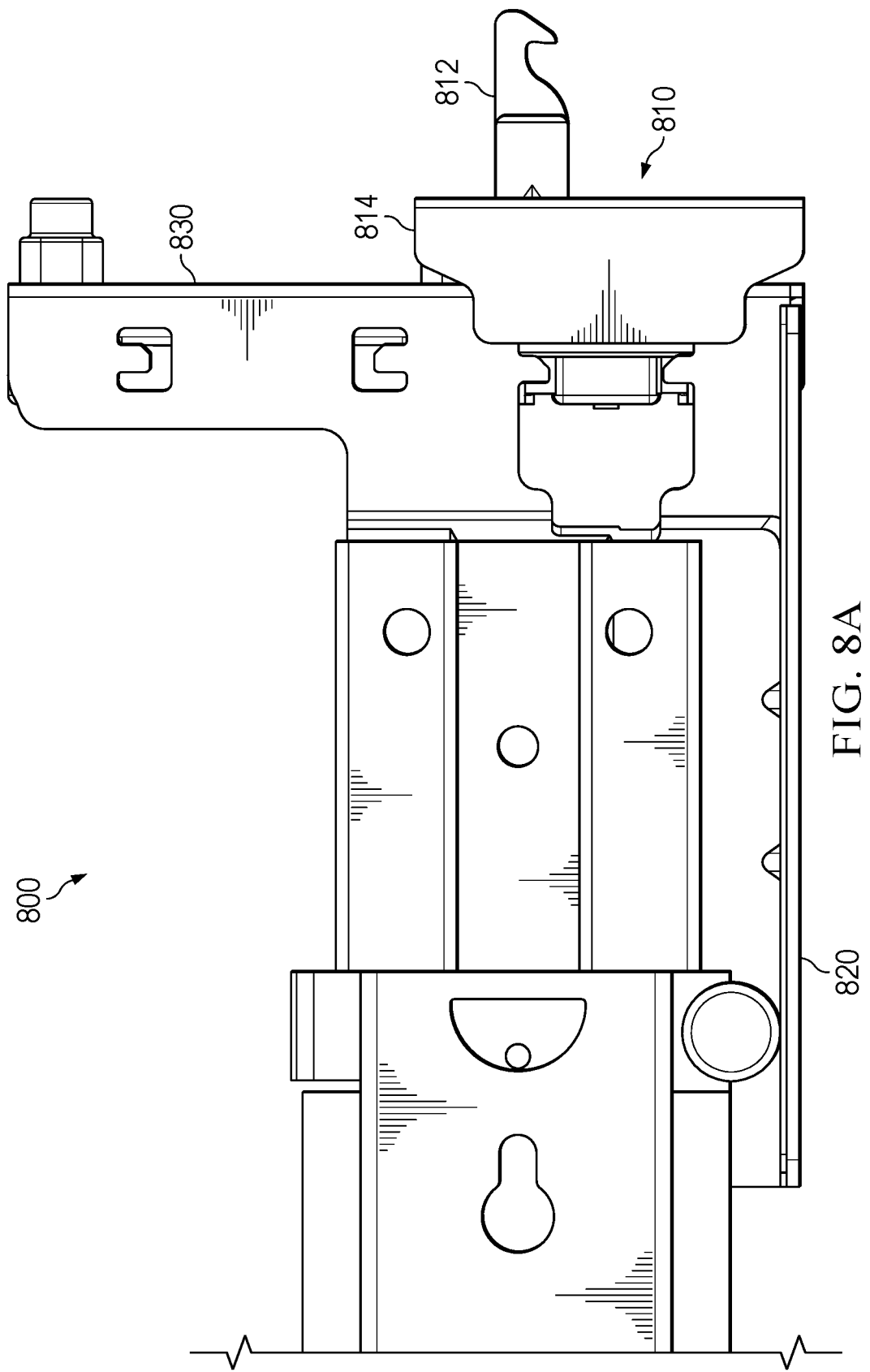
FIGS. 8A, 8B, 8C, 8D and 8E, generally referred to as FIG. 8, respectively show a side view, a front view, a bottom view, a left perspective view and a right perspective view of a front connection portion of a hybrid rail support component.
Figure 8B:
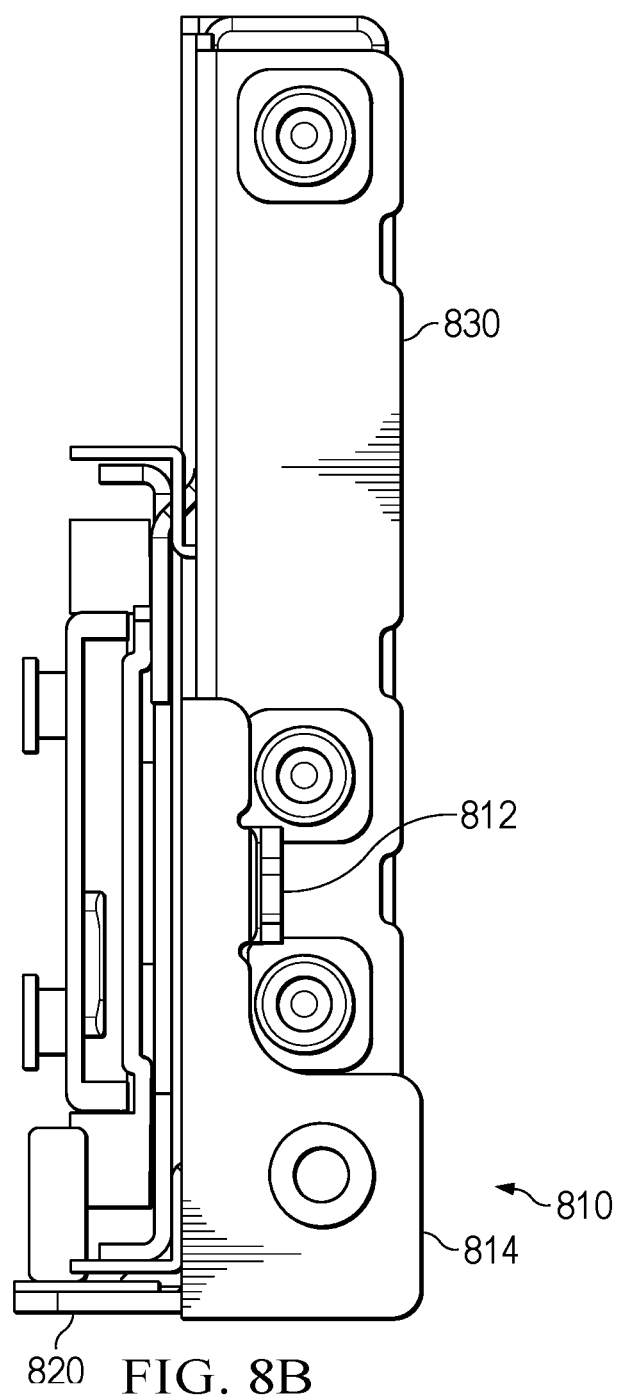
Figure 8C:
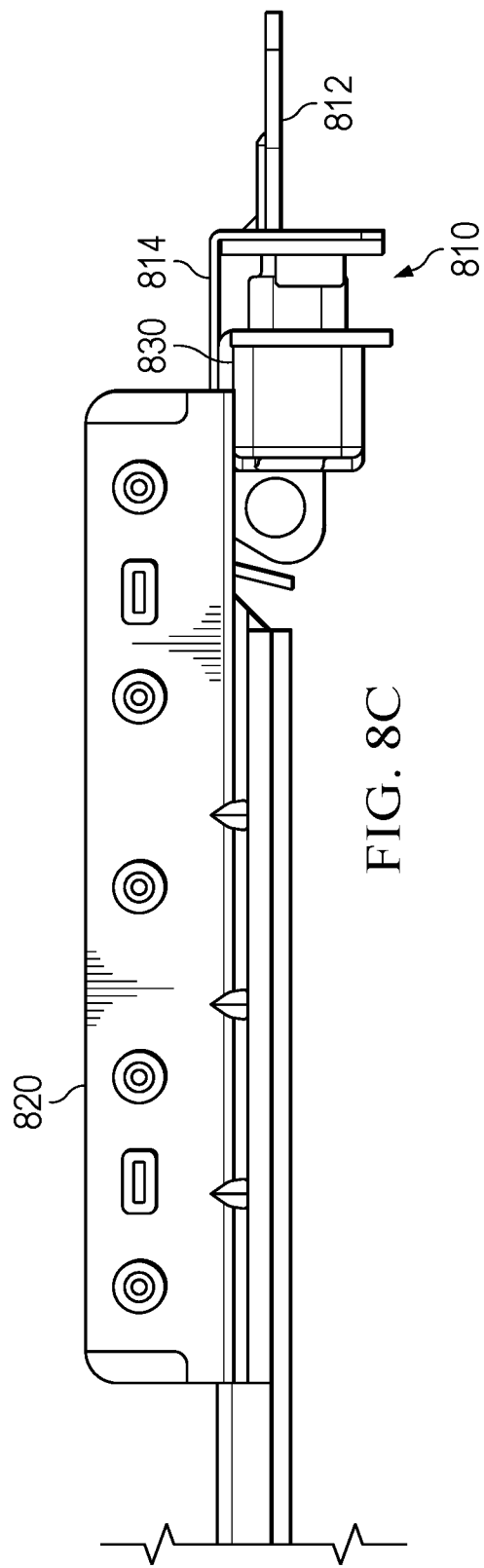
Figure 8D:
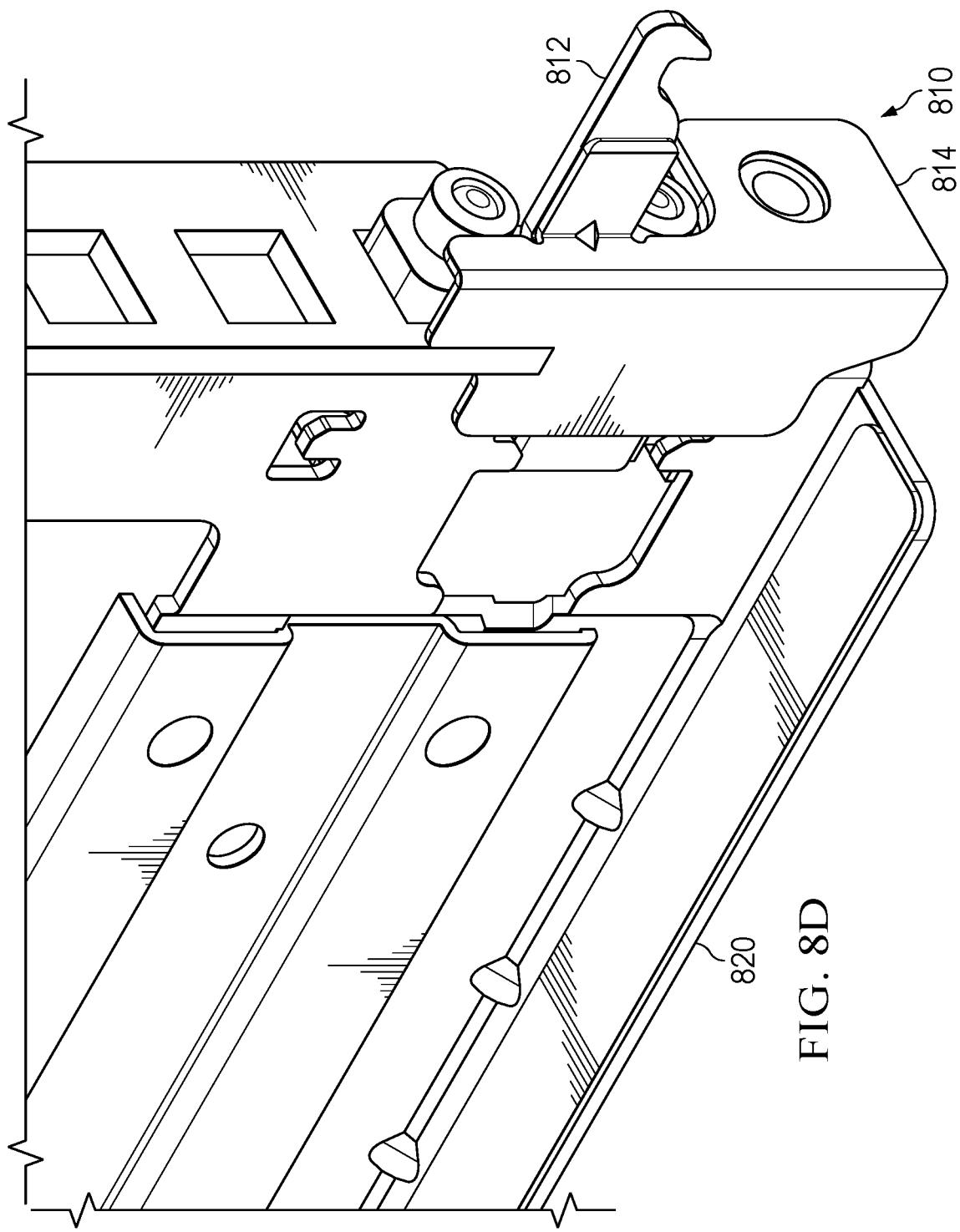
Figure 8E:
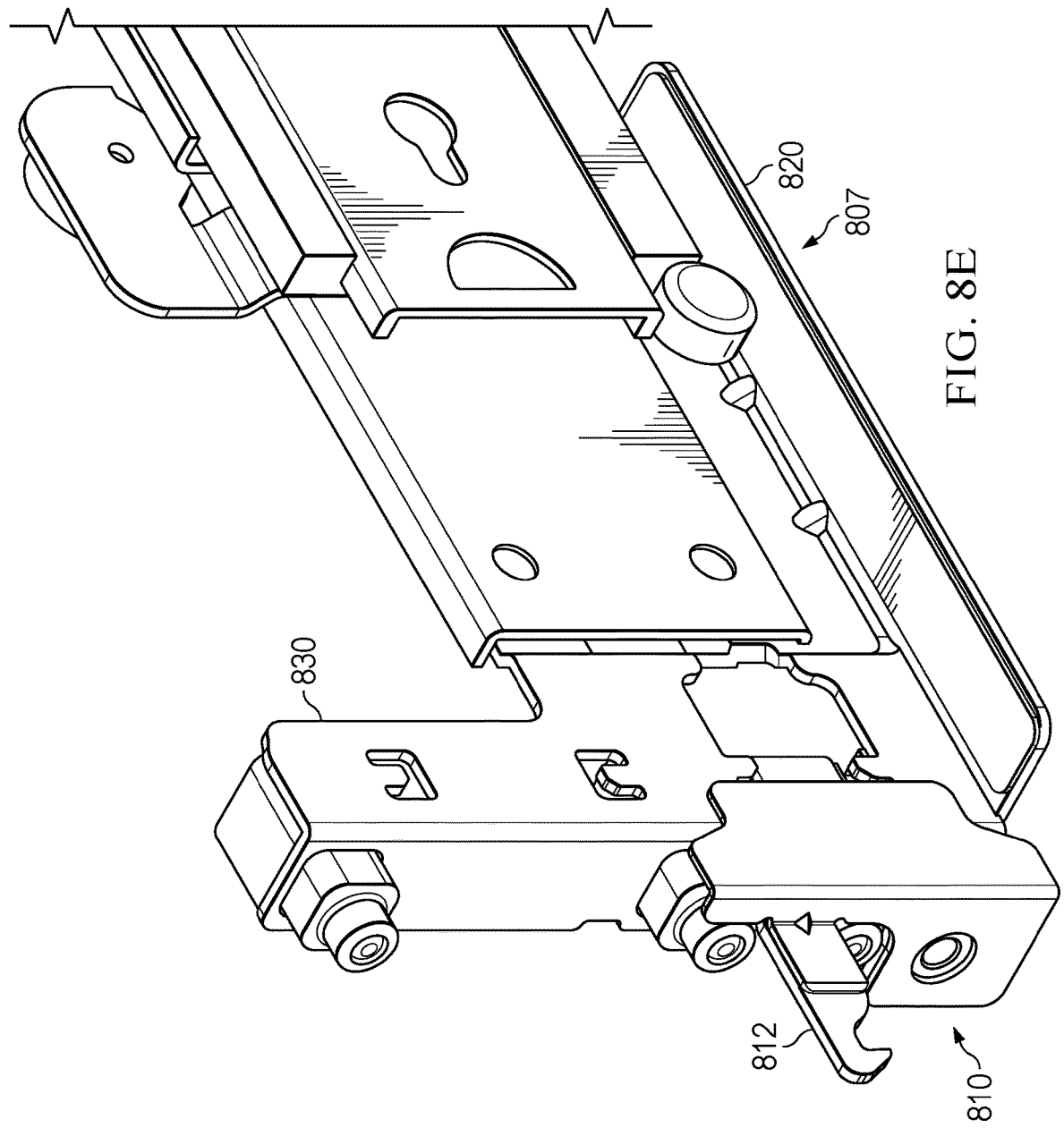

FIGS. 7A and 7B, generally referred to as FIG. 7, show perspective views of a hybrid rail support component 700. In certain embodiments, the hybrid rail support component 700 is configured as a sliding ball bearing rail design with a static rail 720 and a sliding rail 730. In certain embodiments, the static rail 720 includes sliding rail ball bearings along which the sliding rail 730 moves from an inserted position to an extended position. In certain embodiments, when the sliding rail 730 is in the extended position, the sliding rail extends to substantially half the position of a fully extended information handling system (i.e., the rack service position).

In certain embodiments, the hybrid rail support component 700 includes a rail top wheel 750 which interacts with the rail 730, allowing the system to be slid out to service position. In certain embodiments, the rail top wheel 750 is physically attached to a top portion of the static rail. In certain embodiments, the rail top wheel 750 is attached to the static rail 720 via a sliding wheel flange. In certain embodiments, the rail top wheel 750 performs a mid to rear top chassis friction reduction operation. In certain embodiments, the mid to rear top chassis friction reduction operation performed by the rail top wheel 750 re-distributes the weight to the static member top surface to reduce friction/camber/etc. along the top surface of the static rail.

In certain embodiments, the mid to rear top chassis friction reduction operation reduces friction to the mid to rear of the top of the chassis as the chassis is extended to the rack service position and inserted back to an operational position. In certain embodiments, the mid to rear top chassis friction reduction operation reduces friction to respective outside edges of the mid to rear of the top of the chassis as the chassis is extended to the rack service position and inserted back to an operational position. In certain embodiments, the mid to rear top friction reduction operation reduces friction to respective outside edges of the mid to rear of the top of the chassis via the static rail 730 which is physically attached to the mid to rear portion of the chassis. In certain embodiments, the mid to rear top chassis friction reduction operation applies a downward pressure to the outside edges of the mid to rear of the top of the chassis as the chassis is extended to the rack service position and inserted back to an operational position. In certain embodiments, the mid to rear top chassis friction reduction operation applies a downward pressure to the outside edges of the mid to rear of the top of the chassis via the static rail 730 which is physically attached to the mid to rear portion of the chassis. In certain embodiments, the downward pressure offsets the additional weight of the front portion of the information handling system as the information handing system is extended to the rack service position and inserted back to an operational position.

In certain embodiments, the hybrid rail support component 700 includes a front to mid bottom chassis friction reducing component 740.

In certain embodiments, the hybrid rail support component 700 includes attachment portions 760 and 762. In certain embodiments, the attachment portions 760 and 762 are used to attach the hybrid rail support components 700 to front and rear portions of a rack. In certain embodiments, the front to mid bottom chassis friction reducing component 740 is associated with the front attachment portion 760.

Figure 9A:
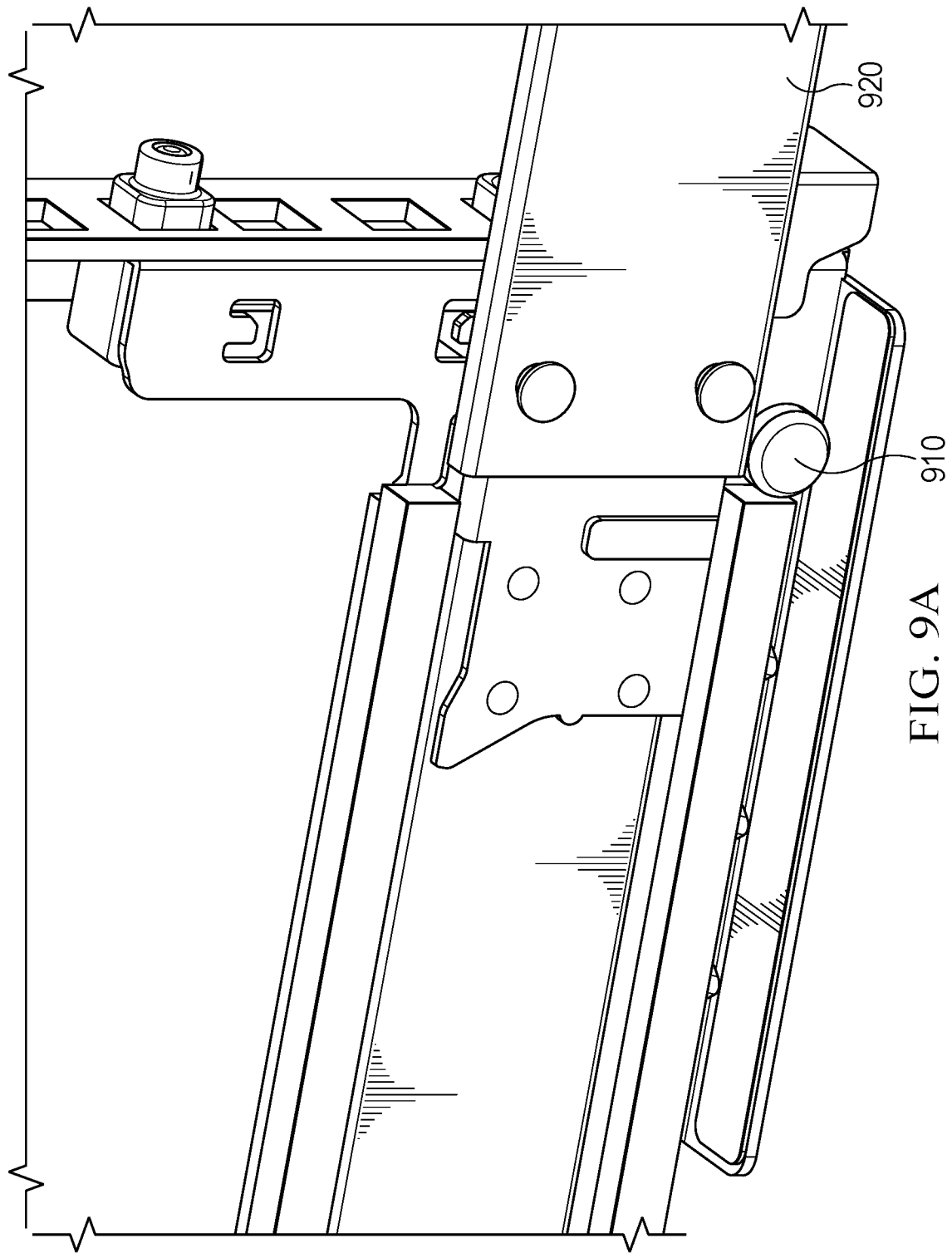
FIGS. 9A and 9B, generally referred to as FIG. 9, show a right perspective view and a side view of a hybrid rail support component when a rail of the hybrid support component is in an extended orientation.
Figure 9B:
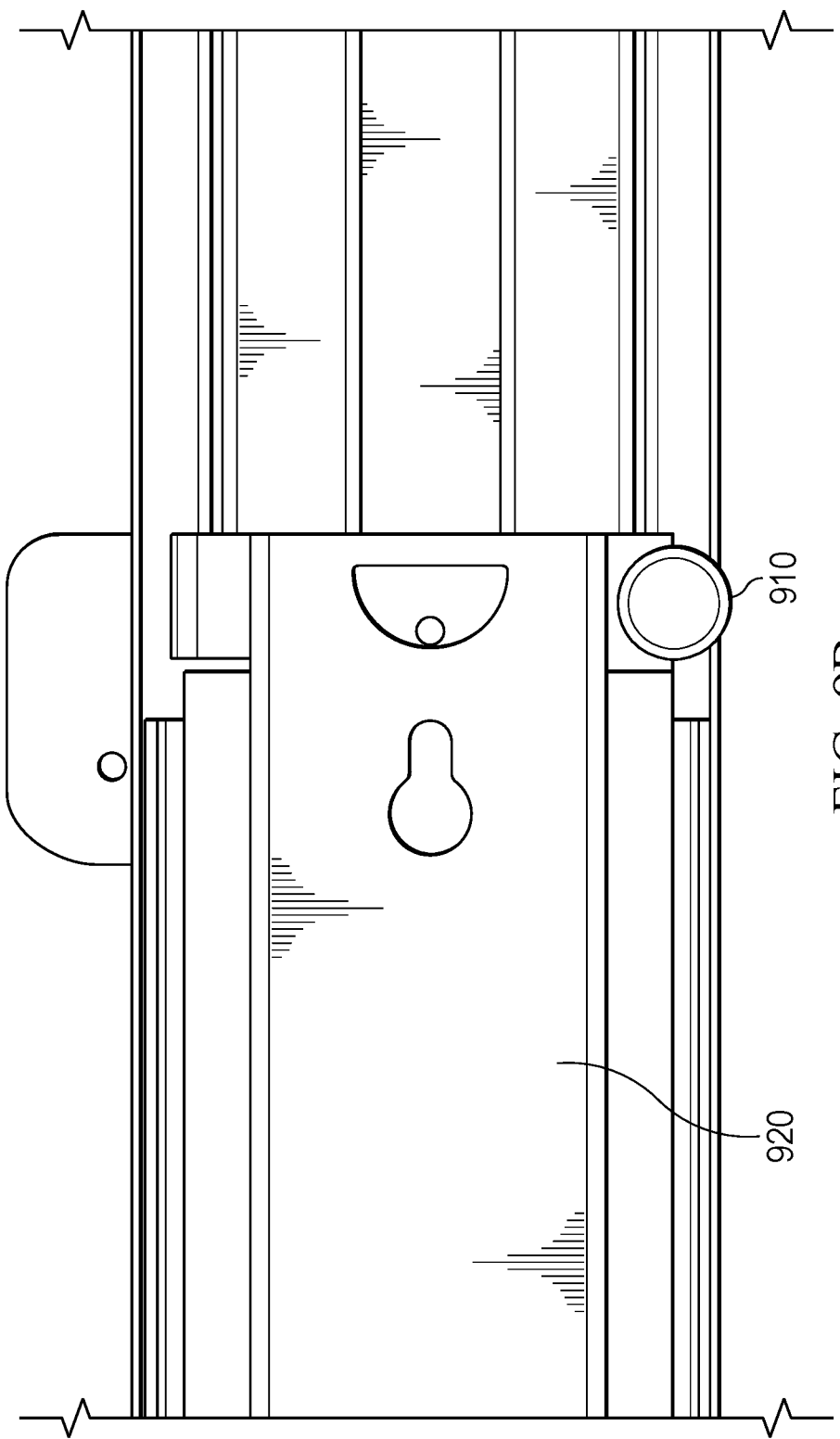

FIGS. 8A, 8B, 8C, 8D and 8E, generally referred to as FIG. 8, respectively show a side view, a front view, a bottom view, a left perspective view and a right perspective view of a front connection portion 800 of a hybrid rail support component. FIGS. 9A and 9B, generally referred to as FIG. 9, show a right perspective view and a side view of a hybrid rail support component when a rail of the hybrid support component is in an extended orientation. In certain embodiments, the front connection portion 800 of the hybrid rail support component includes a slam latch component 805 and a front to rear bottom chassis friction reducing component 807.

In certain embodiments, the slam latch component 805 includes a rail mount wrap around portion 810, an extended slam latch hook 812, or a combination thereof. In certain embodiments, the extended slam latch hook 812 is configured to extend beyond the rail mount wrap around portion 810. In certain embodiments, the rail mount wrap around portion 810 is configured to wrap from a front of a mounting portion of the hybrid rail component to an outside 830 of the mounting portion of the hybrid rail mounting portion. By being so configured, the rail mount wrap around portion 810 enables clearance with the server rack for the wider width portion of the chassis when the chassis is extended to the rack service position and inserted back to an operational position.

In certain embodiments, the front to mid bottom chassis friction reducing component 807 performs a front to mid bottom and side friction reduction operation. In certain embodiments, the front to mid bottom chassis friction reduction operation reduces friction to the front to mid of the bottom and side of the chassis as the chassis is extended to the rack service position and inserted back to an operational position. In certain embodiments, the front to mid bottom chassis friction reduction operation reduces friction to respective outside edges of the front to mid of the bottom of the chassis as the chassis is extended to the rack service position and inserted back to an operational position. In certain embodiments, the front to mid bottom chassis friction reduction operation applies an upward pressure to the outside edges of the front to mid of the bottom of the chassis as the chassis is extended to the rack service position and inserted back to an operational position. In certain embodiments, the upward pressure offsets the additional weight of the front portion of the information handling system as the information handing system is extended to the rack service position and inserted back to an operational position.

In certain embodiments, the front to mid bottom chassis friction reducing component 807 includes a static rail L flange 820 which provides additional support to the wider width information handling system when the wider width information handling system is in the rack service position. In certain embodiments, the static rail L flange 820 includes a flange shelf extending inwardly from the static rail. In certain embodiments, the static rail L flange 820 includes a friction reducing portion which reduces system friction as the chassis is extended to the rack service position and inserted back to an operational position. In certain embodiments, the friction reducing portion includes a nylon plate positioned on an inside top portion of the shelf of the static rail L flange, a flange support wheel positioned on an inside side portion of the static rail L flange, or a combination thereof. In certain embodiments, the flange support wheel supports the static rail as the static rail is extended to the rack service position and inserted back to an operational position.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

Consequently, the invention is intended to be limited only by the spirit and scope of the appended claims, giving full cognizance to equivalents in all respects.

What is claimed is:

1. A hybrid rail support component for a server type information handling system, comprising:
    a static rail, the static rail being configured to mount to a side of a server rack; and,
    a sliding rail, the sliding rail being configured to move along the static rail from an inserted position to an extended position, the sliding rail being configured to mount to a rear portion of a wider width information handling system chassis, the sliding rail enabling the wider width information handling system chassis to extend from a rack to a rack service position; and wherein
    the static rail includes a rail top wheel coupled to a top portion of the static rail; and
    the static rail includes a slam latch component, the slam latch component comprising an extended slam latch hook and a rail mount wrap around portion, the extended slam latch being configured to extend beyond the rail mount portion, the rail mount wrap around portion being configured to wrap from a front of a mounting portion and enable clearance with the server rack for the wider width information handling system chassis.

2. The hybrid rail support component of claim 1, wherein:
    the static rail includes a bottom chassis friction reducing component.

3. The hybrid rail support component of claim 2, wherein:
    the bottom chassis friction reducing component includes a static rail L flange, the static rail L flange including a shelf.

4. The hybrid rail support component of claim 2, wherein:
    the bottom chassis friction reducing component includes a flange support wheel, the flange support wheel being positioned on an inside side portion of the bottom chassis friction reducing component.

5. A server rack comprising:
    a hybrid rail support component extending from a front portion of the server rack to a rear portion of the server rack, the hybrid rail support component comprising:
        a static rail, the static rail being configured to mount to a side of a server rack; and,
        a sliding rail, the sliding rail being configured to move along the static rail from an inserted position to an extended position, the sliding rail being configured to mount to a rear portion of a wider width information handling system chassis, the sliding rail enabling the wider width information handling system chassis to extend from a rack to a rack service position; and wherein
        the static rail includes a rail top wheel coupled to a top portion of the static rail; and
        the static rail includes a slam latch component, the slam latch component comprising an extended slam latch hook and a rail mount wrap around portion, the extended slam latch being configured to extend beyond the rail mount portion, the rail mount wrap around portion being configured to wrap from a front of a mounting portion and enable clearance with the server rack for the wider width information handling system chassis.

6. The server rack of claim 5, wherein:
    the static rail includes a bottom chassis friction reducing component.

7. The server rack of claim 6, wherein:
    the bottom chassis friction reducing component includes a static rail L flange, the static rail L flange including a shelf.

8. The server rack of claim 6, wherein:
    the bottom chassis friction reducing component includes a flange support wheel, the flange support wheel being positioned on an inside side portion of the bottom chassis friction reducing component.

9. A hybrid rail support system comprising:
    a wider width information handling system chassis; and,
    a hybrid rail support component extending from a front portion of the server rack to a rear portion of the server rack, the hybrid rail support component comprising:
        a static rail, the static rail being configured to mount to a side of a server rack; and,
        a sliding rail, the sliding rail being configured to move along the static rail from an inserted position to an extended position, the sliding rail being configured to mount to a rear portion of the wider width information handling system chassis, the sliding rail enabling the wider width information handling system chassis to extend from a rack to a rack service position; and wherein
        the static rail includes a rail top wheel coupled to a top portion of the static rail; and
        the static rail includes a slam latch component, the slam latch component comprising an extended slam latch hook and a rail mount wrap around portion, the extended slam latch being configured to extend beyond the rail mount portion, the rail mount wrap around portion being configured to wrap from a front of a mounting portion and enable clearance with the server rack for the wider width information handling system chassis.

10. The hybrid rail support system of claim 9, wherein:
    the static rail includes a bottom chassis friction reducing component.

11. The hybrid rail support system of claim 10, wherein:
the bottom chassis friction reducing component includes
   a static rail L flange, the static rail L flange including a shelf.

12. The hybrid rail support system of claim 10, wherein:
the bottom chassis friction reducing component includes
   a flange support wheel, the flange support wheel being positioned on an inside side portion of the bottom chassis friction reducing component.

\* \* \* \* \*